United States Patent
Shipley et al.

(10) Patent No.: US 7,215,552 B2
(45) Date of Patent: May 8, 2007

(54) AIRFLOW REDISTRIBUTION DEVICE

(75) Inventors: James C Shipley, Gilbert, AZ (US); Javier Leija, Chandler, AZ (US); Christopher A Gonzales, Chandler, AZ (US); Christopher D Lucero, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 286 days.

(21) Appl. No.: 11/087,256

(22) Filed: Mar. 23, 2005

(65) Prior Publication Data

US 2006/0215363 A1    Sep. 28, 2006

(51) Int. Cl.
*H05K 7/20*    (2006.01)

(52) U.S. Cl. .................. 361/721; 361/695; 361/719; 165/80.2; 165/104.33; 165/122; 174/16.1; 454/184

(58) Field of Classification Search ............... None
See application file for complete search history.

(56) References Cited

U.S. PATENT DOCUMENTS

| | | | | |
|---|---|---|---|---|
| 3,699,393 A | * | 10/1972 | Reimer | 361/797 |
| 5,210,680 A | * | 5/1993 | Scheibler | 361/695 |
| 5,535,099 A | * | 7/1996 | McCarthy et al. | 361/800 |
| 5,684,674 A | * | 11/1997 | Yin | 361/695 |
| 5,995,368 A | * | 11/1999 | Lee et al. | 361/695 |
| 6,118,667 A | * | 9/2000 | Grosser et al. | 361/752 |
| 6,442,035 B1 | * | 8/2002 | Perry et al. | 361/756 |
| 6,744,633 B1 | * | 6/2004 | Dials et al. | 361/752 |
| 6,801,428 B2 | * | 10/2004 | Smith et al. | 361/687 |
| 6,922,337 B2 | * | 7/2005 | Malone et al. | 361/695 |

OTHER PUBLICATIONS

"ATCA Specification", *PICTMG 3.0 R1.0 ATCA Specification*, Dec. 30, 2002, PICTMG 3.0 R1.0 Specification Section 5 (Thermal),(Dec. 30, 2002),257-269.

* cited by examiner

*Primary Examiner*—Boris Chervinsky
(74) *Attorney, Agent, or Firm*—Douglas J. Ryder; Ryder IP Law, PC

(57) ABSTRACT

In general, in one aspect, the disclosure describes an apparatus to redistribute airflow throw slots of a chassis that houses boards. The apparatus includes at least one restriction region to limit airflow therethrough. The apparatus further includes an open region to allow airflow to pass therethrough. At least some of the airflow limited by the at least one restriction region will flow through the open region. The apparatus also includes a connection mechanism to connect to a chassis.

25 Claims, 6 Drawing Sheets

AIRFLOW REDISTRIBUTION DEVICE

BACKGROUND

Modular computing systems contain many boards and/or interconnects (hereinafter referred to as "boards") that can be easily inserted and removed from a rack (chassis). These systems provide large amounts of processing in a small environment. The boards within the rack will require cooling. High processing components on the boards will generate the most heat and will require the most cooling. As the modular computing systems are tightly bundled the effectiveness of heat sink technology is limited by the limited space available. The chassis' will be designed to provide airflow for cooling of components.

The chassis' are often governed by standards, such as the PCI Industrial Computer Manufacturers Group (PICMG), Advanced Telecommunications Computing Architecture (ATCA) Base Specification, PIGMG 3.0 Revision 1.0, published Dec. 30, 2002 (hereinafter referred to as "the ATCA specification"). Accordingly, the airflow design of the chassis may not be optimized for any particular use. Accordingly, the airflow may not be efficient for particular boards. Furthermore, the airflow through the slots may not be evenly distributed. Moreover, as the processing power of the boards and the associated heat generation of the boards increases, the chassis may not provide sufficient airflow to provide cooling for these heat generating components.

BRIEF DESCRIPTION OF THE DRAWINGS

The features and advantages of the various embodiments will become apparent from the following detailed description in which.

DETAILED DESCRIPTION

Figure 1:
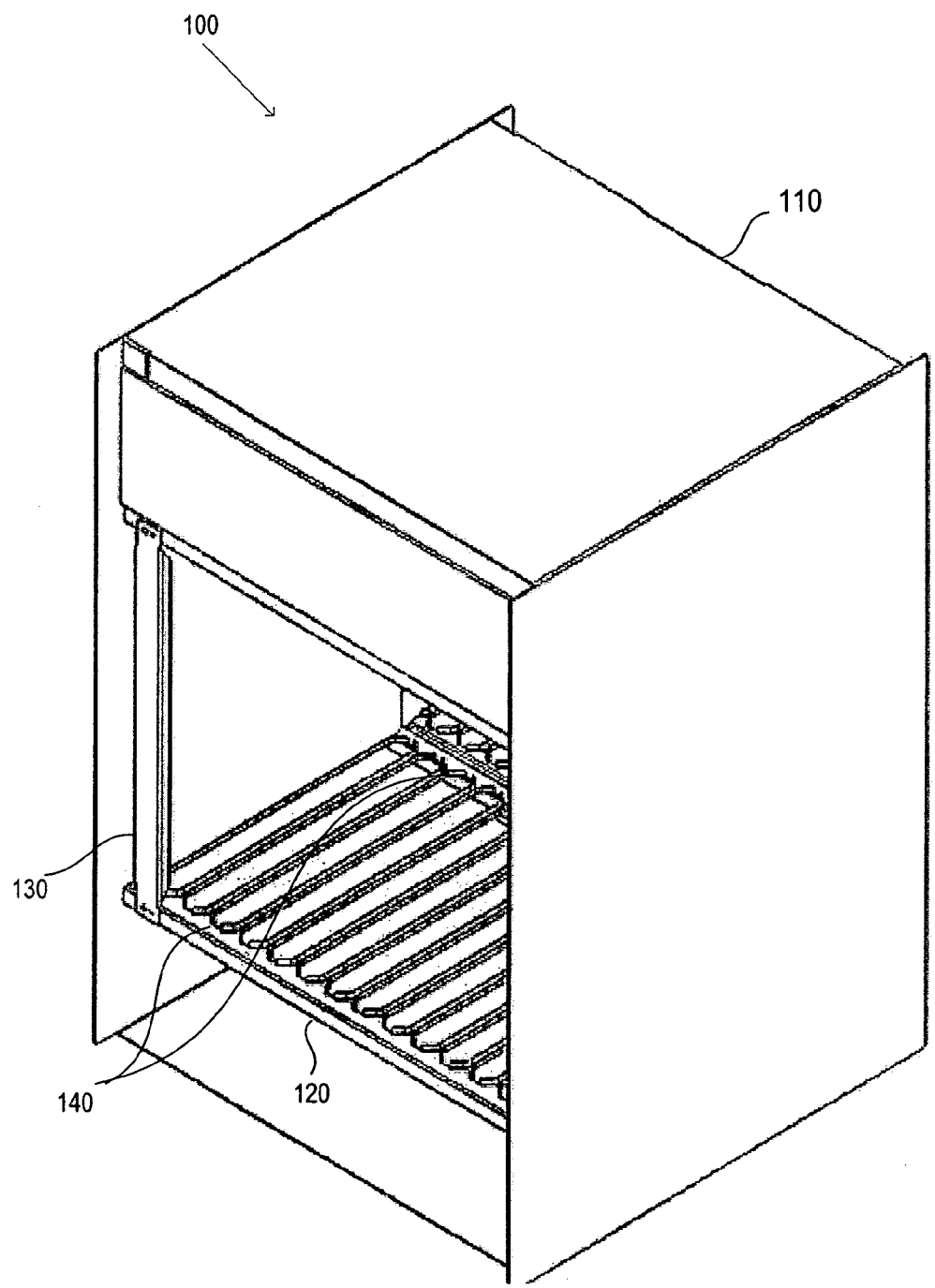
FIG. 1 illustrates a perspective view of an example chassis (rack), according to one embodiment.

FIG. 1 illustrates a perspective view of an example chassis (rack) 100 for use with embedded computer systems. The chassis 100 includes a housing 110 (e.g., outer shell, walls) and a frame 120 for holding boards 130 (e.g., ATCA blades). Only a single board 130 is illustrated installed in the frame 120 and no components are illustrated on the board 130 for simplicity. The frame 120 consists of upper and lower rails 140 (guide rails) that guide the boards into the housing 110. It should be noted that only the lower rails 140 are visible in FIG. 1. As illustrated, the boards 130 reside vertically in the chassis 100. A back edge (not illustrated) of the boards 130 may plug into adapters (not illustrated) in the chassis 100. The adapters may enable the boards 130 within the chassis 100 to communicate with one anther and/or may enable the boards 130 to communicate external to the chassis 100 (with other computers or systems).

The chassis 100 may be a governed by standards (e.g., the ATCA specification). The standards may control, the size of the chassis, the number of slots (shelves) in the chassis, the cooling provided by the chassis, where the components are placed on the boards, electrostatic discharge (ESD) parameters, as well as other aspects. For example, the ATCA specification requires that each slot (shelf) have an ESD wrist strap terminal on the front of the slot and that the terminal be unpainted.

The example chassis 100 illustrated is based on the ATCA specification. The various embodiments illustrated herein will be based on the ACTA chassis. However, this is in no way intended to limit the scope of the various embodiments to a chassis based on the ACTA specification. In fact, the various embodiments described herein need not be limited to chassis' governed by standards, chassis' that insert boards vertically, or chassis' that support specific board types. Rather, the various embodiments described herein could be applied to any type of chassis for holding equipment (e.g., electronic equipment) that requires cooling.

Figure 2:
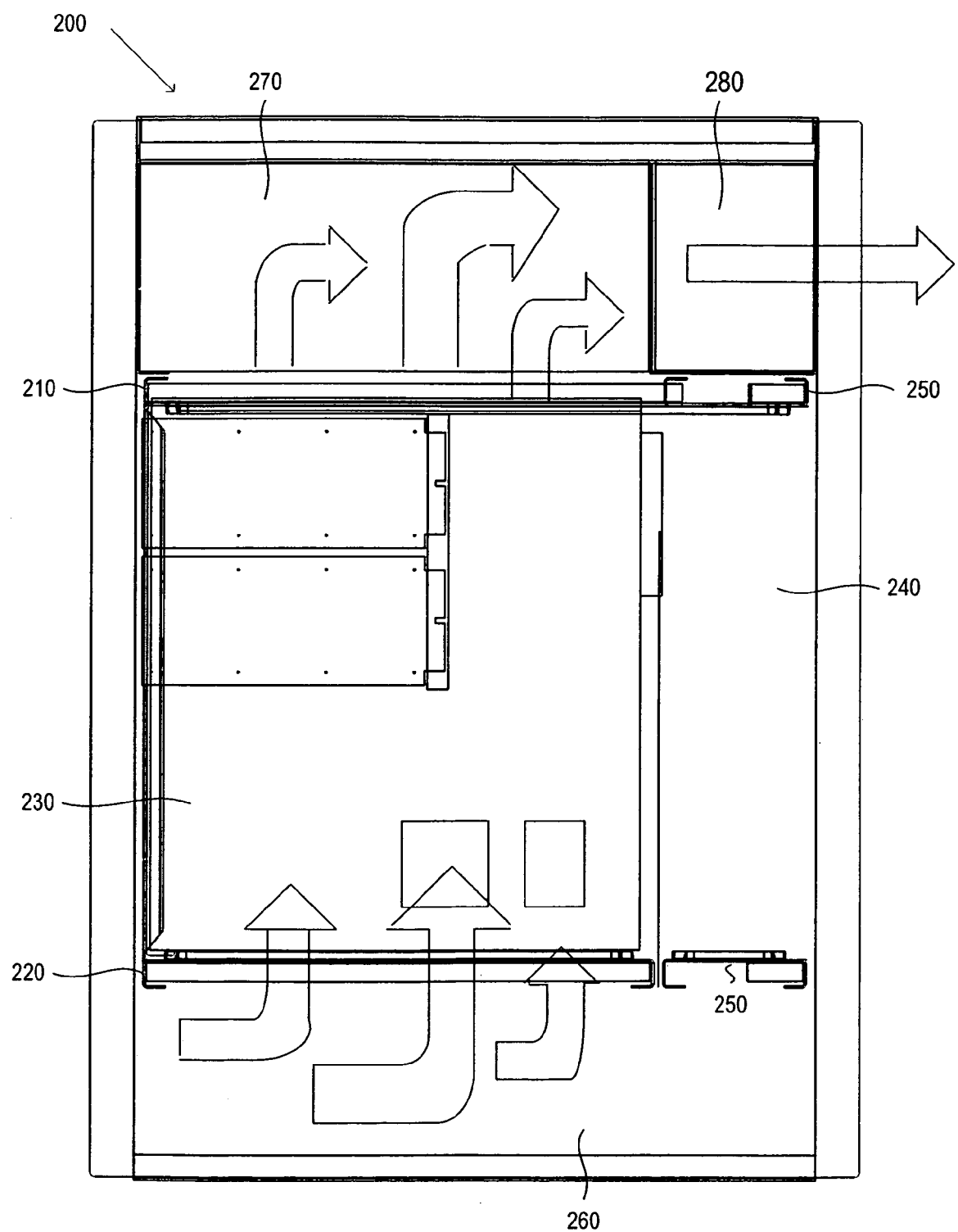
FIG. 2 illustrates a cross-sectional side view of an example chassis and typical airflow pattern thereof, according to one embodiment.

FIG. 2 illustrates a side view of an example chassis 200. The chassis includes upper guide rails 210 and lower guide rails 220. Between the guide rails 210, 220 boards (e.g., ATCA blades) 230 are installed vertically. Only a single board 230 having several components mounted thereon is visible but multiple boards 230 are likely included in the chassis 200. Behind the boards 230 is an interface area 240 (no interface equipment is illustrated). The interface area 240 may house a backplane to provide connectivity between the boards 230 and power to the boards 230. In addition, the interface area 240 may include transmission modules that provide connectivity between the boards 230 and external sources. The interface area 240 may have guide rails 250 for supporting the interface equipment. Below the boards 230 is an open space (lower open space) 260 and above the boards 230 is open space (upper open space) 270. At one end of the upper open space (e.g., rear) is a fan (or fans) 280. The fan 280 and the upper and lower open spaces 260, 270 may act as an air flow system. The air flow system may pull air through the chassis 200 (up from the lower open space 260 across the boards 230 to the upper open space 270). Pulling the air through the chassis 200 may cool the boards 230 inserted in the chassis 200.

Airflow through the chassis 200 and across the boards 230 in the chassis 200 may or may not be evenly dispersed. For example, the airflow through the chassis 200 may tend to be strongest in the center and weaker towards the edges of a board 230 as indicated by the arrows (larger arrows indicating more air flow). Such an airflow pattern means that components on the center of the board 230 will be cooled more then components on the edges of the board 230. Depending on the placement of components on the board 230, this type of airflow may or may not be efficient and/or sufficient. That is, if the components creating the most heat are located in the region receiving the most airflow then passing the most air over this portion would be preferable. However, the components generating the most heat are not always placed in the center of the board 230. For some board designs the heat generating components may be best placed on an edge of the board 230 for communications with other boards or other devices.

An important aspect of the airflow through the chassis is the chassis design. That is, the chassis design may play a role in or dictate the average maximum airflow that is possible through the chassis. As the airflow may not be evenly distributed, it is possible that the chassis will not be able to provide an acceptable airflow for heat generating components that are not placed in the strongest airflow regions of the board (e.g., center). That is, if the average maximum airflow attainable is 500 linear feet per minute (LFM) the airflow may be distributed in such a way that 550 LFM is attained at the center and only 450 LFM is attainable at the edges. If a component (or components) generating a large amount of heat is located on the side of the board and needs an airflow of 500 LFM to keep the component (or components) cool, the chassis may be not able to support that configuration.

Alternatively, increasing the airflow for components not aligned with the most efficient air flow portion of the board (e.g., center) may result in excess cooling taking place at the most efficient portion. For example, if an airflow of 500 LFM was required for a heat generating component (or components) that were located on the edge of the board may result in an airflow of 600 LFM at the center of the board which may not have any heat generating components or may need much less airflow.

The airflow through the chassis needs to be controlled or diverted (e.g., improved) so that the most airflow is directed to the area on the board having the most heat generation. Improving the airflow would enable components to be placed on the board based on operational factors not heating issues. One possible way to improve the airflow is by restricting the airflow to portions of the board that do not need as much airflow and accordingly increasing the airflow to other portions that need more airflow. A baffle could be used to control the airflow over a board.

Figure 3:
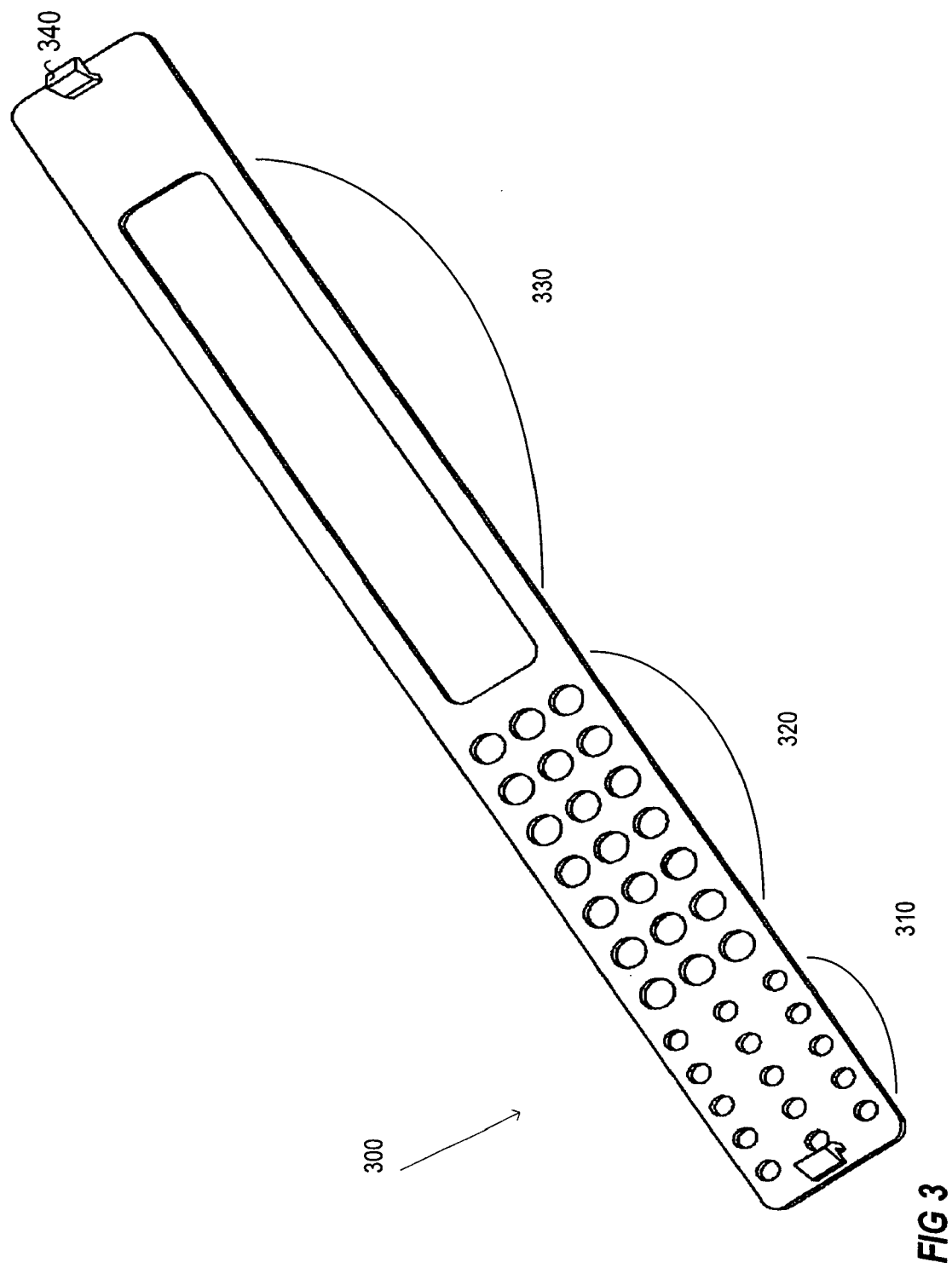
FIG. 3 illustrates an example baffle, according to one embodiment.

FIG. 3 illustrates an example baffle 300 that could be used to control the airflow through a chassis (e.g., chassis 100, 200). The baffle 300 includes openings of varying sizes. The biggest opening allowing the most air to flow and the smallest opening restricting the most airflow. Using the baffle 300 redirects some of the airflow from the more restricted areas to the less restricted areas as air flow will tend to move to the path of least resistance.

The example baffle 300 has three distinct regions of air restriction to control airflow. A first region 310 consists of a plurality of small holes. The small holes would provide the most restriction to the airflow as the air would need to be pulled through these small holes. A second region 320 consists of a plurality of medium size holes that would restrict airflow but not to the extent that airflow would be restricted by the first region 310. A third region 330 consists of an opening that provides little or no resistance to the flow of air. The air being restricted from the first and the second regions 310, 320 (restricted regions) may be redirected to the third region 330 (open region). Accordingly, the airflow through the third region 330 may be increased while the airflow through the first and second regions 310, 320 may be decreased. It should be noted that the baffle 300 is in no way limited to the illustrated embodiment. Rather, any number of configurations and any number of different regions can be used with departing from the scope of the various embodiments described herein.

Figure 4:
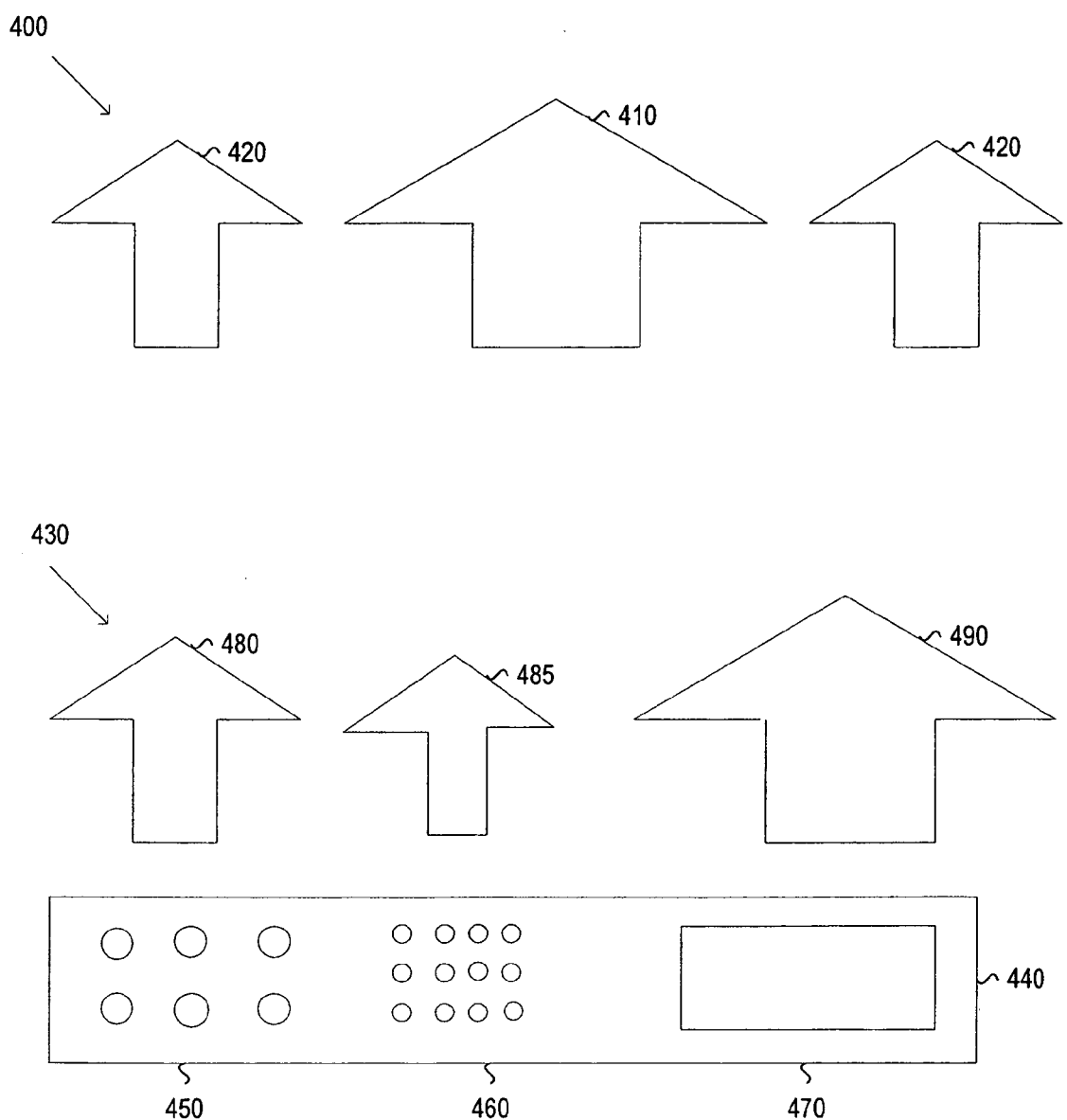
FIG. 4 illustrates example airflows with and without a baffle, according to one embodiment.

FIG. 4 illustrates example airflows with no baffle and utilizing a baffle. The example airflow 400 with no baffle is strongest in the center 410 and tapers off toward the edges 420. For example, if the average airflow through the chassis 400 is 500 LFM then the center airflow 410 may be 550 LFM and the edge airflow 420 may be 450 LFM. The example airflow 430 is controlled by the baffle 440. The baffle 440 has three distinct restriction regions. A first region 450 has a plurality of medium size holes for medium restriction. A second region 460 has a plurality of small holes for substantial restriction. A third region 470 is a large opening for minimal or no restriction. The airflow through the baffle 440 is greatest where there is least restriction and least where there is the most restriction. For example, if the average chassis airflow 430 is 500 LFM then the airflow 480 associated with the first region 450 may also be 500 LFM (compared to the 450 LFM airflow 420 with no baffle). The airflow 485 associated with the second region 460 may be 400 LFM (compared to the 550 LFM center airflow 410 with no baffle). The airflow 490 associated with the third region 470 may be 600 LFM (compared to the 450 LFM edge airflow 420 with no baffle).

As noted above, the airflow rate through the chassis and the slots within the chassis can be considered constant. The baffle takes advantage of the relatively constant airflow rate provided by the chassis to alter the airflow resistance across the slots without impacting the overall chassis airflow performance. The baffle's free area ratio (or vent hole size and location) across the slot can be tailored to improve the local airflow velocity for components that need it most. The baffle diverts the airflow to prescribed area needing the most airflow. The end result of using the baffle is improved airflow in the chassis to increase the cooling capacity for the board (e.g., ATCA blade).

The example baffles 300, 400 of FIGS. 3 and 4 consist of three distinct regions and the regions that restrict airflow consist of a plurality of holes. However, the baffle is in no way limited thereby. The baffle could have as many distinct regions as desired. For example, a baffle could have a single open portion to force all the airflow to that portion or could have five distinct portions to provide five airflow patterns across the board. The restrictive portions could be any assortment of holes, lines, patterns that provide various levels of restriction. For example, a restrictive portion could be a plurality of thin lines while a moderate restriction could be a plurality of moderate sized lines.

Referring back to FIG. 3, the various regions 310, 320, 330 may correspond to the components on the board and their need for cooling. Components needing the least cooling may be aligned with the first region 310 (most restricted region), components needing intermediate cooling may be aligned with the second region 320, and components needing the most cooling are aligned with the third region 330 (least restricted region). Aligning the regions of the baffle 300 with the associated cooling requirements of components on the board provides the most efficient use of airflow. Using the baffle 300 in the chassis (e.g., chassis 100, 200) may modify the airflow and accordingly improve the cooling capacity for high heat generating components placed on the boards inserted in the chassis.

The baffle 300 modifies the airflow resistance across the slot and forces air to flow through the paths of least resistance. The baffle 300 extends the cooling capacity of processors and chipsets particularly in confined spaces (e.g., ATCA blades). The baffle 300 reduces the dependence of component placement, particularly with high heat generating components (e.g., processors). The baffle 300 takes advantage of the relatively constant airflow rate provided by the chassis (e.g., ATCA chassis) to alter the airflow resistance across the slot thus improving the local airflow rate where desired.

Managing the local airflow rate using the baffle 300 allows a board (e.g., ATCA blade) designer to place components where they are better suited for layout and routing conditions (which typically conflict with thermal placement of components). Combined with thermal placement of components, the baffle 300 may further improve the cooling limits. The increased cooling limits may increase the computing density capacity of the boards (e.g., ATCA blades) and/or enable the use of even higher performance (and accordingly higher heat generation) processors and chipsets.

According to one embodiment, the baffle 300 may be produced for the specific board so as to optimize airflow per board based on placement of the heat generating components on the board. Designing the baffle 300 to the specific board provides the most flexibility in board design as placement of the components on the board based on heat generation will not be as much of a factor. The baffle 300 may be sold with the board and/or may be sold as an accessory to the board.

According to one embodiment, the baffles may be designed in a plurality of styles to fit different board types. For example, one baffle type may improve the airflow to the front of the board while another baffle may improve the airflow to the back of the board. When boards are being designed they can be designed taking into account the various baffle styles. The standard baffle types may provide a board designer with flexibility in the design of the board to account for heat generation as there may be various heat dissipation options available.

The baffle 300 may be made of a light weight material (e.g., plastic). The baffle may be made using a typical low cost manufacturing processes (e.g., plastic injection molding). However, the baffle is not limited to the type of material or to the process of making. Rather, the baffle could be made of any material that could provide the airflow improvements without departing from the scope of the various embodiments described herein.

The baffle 300 may also include a connection device 340 to enable the baffle to be connected in the chassis. According to one embodiment, the baffle 300 is connected to the lower guide rails (e.g., 140, 220). Connecting the baffle to the guide rails instead of the board allows the board and the baffle to be installed without interfering with the chassis during installation of the board in the slot. According to one embodiment, the connection device 340 provides a removable rather then permanent connection to the chassis. The connection device 340 may be any type of apparatus (e.g., clip, hook, latch) that would provide a removable secure connection to the guide rails. The connection device 340 may be located on the short edges of the baffle that correspond to the front and back of the slot. The baffle 300 is not limited in the location of the connection device or the number of connection devices. As illustrated, the connection device 340 is a J-clip that extends vertically up from the baffle and then extends diagonally downward and outward. The connection device may be flexible so that it can be inserted in the rails and then will lock into the lower guide rails.

Figure 5:
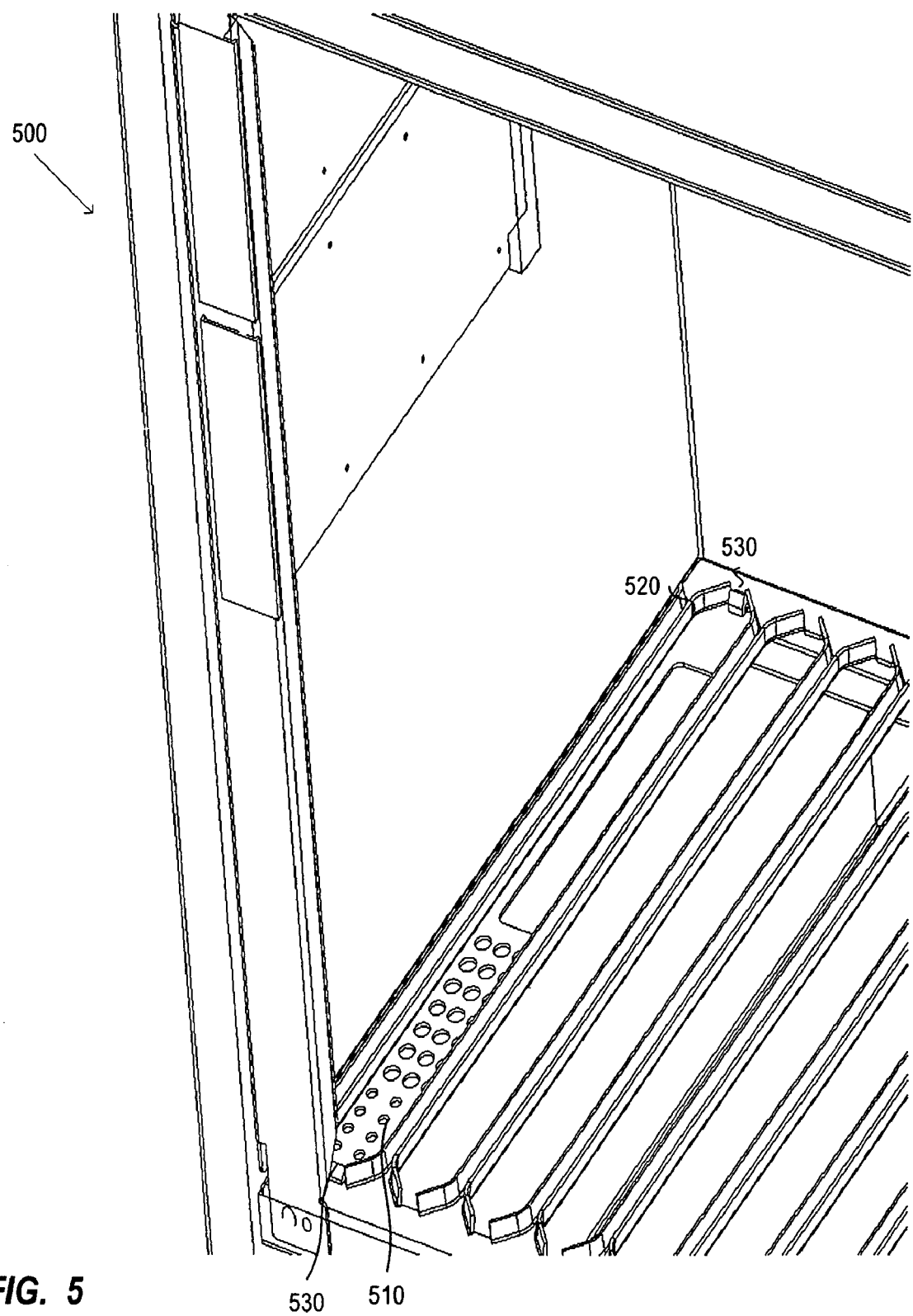
FIG. 5 illustrates an example baffle installed in a chassis, according to one embodiment.

FIG. 5 illustrates an example chassis 500 having an example baffle 510 installed therein. The baffle 510 is connected to a lower guide rail 520 of the chassis. The baffle 510 is removably connected to the front and back of the slot and the lower guide rail 520 utilizing a clip 530 (e.g., connecting mechanism 340) on the baffle 510. The clip 530 connects the baffle to the lower guide rail 520 at the front and back of the slot. The clip 530 extends up through the lower guide rail 520 and then extends over a portion of the lower guide rail 520 to hold the baffle 510 in place. As previously discussed, the baffle 510 restricts and focuses airflow over the board with which it is associated. A different type of baffle could be connected to each lower guide rail associated with each board so as to affect airflow in a different way that is consistent with the make up of the board.

Figure 6:
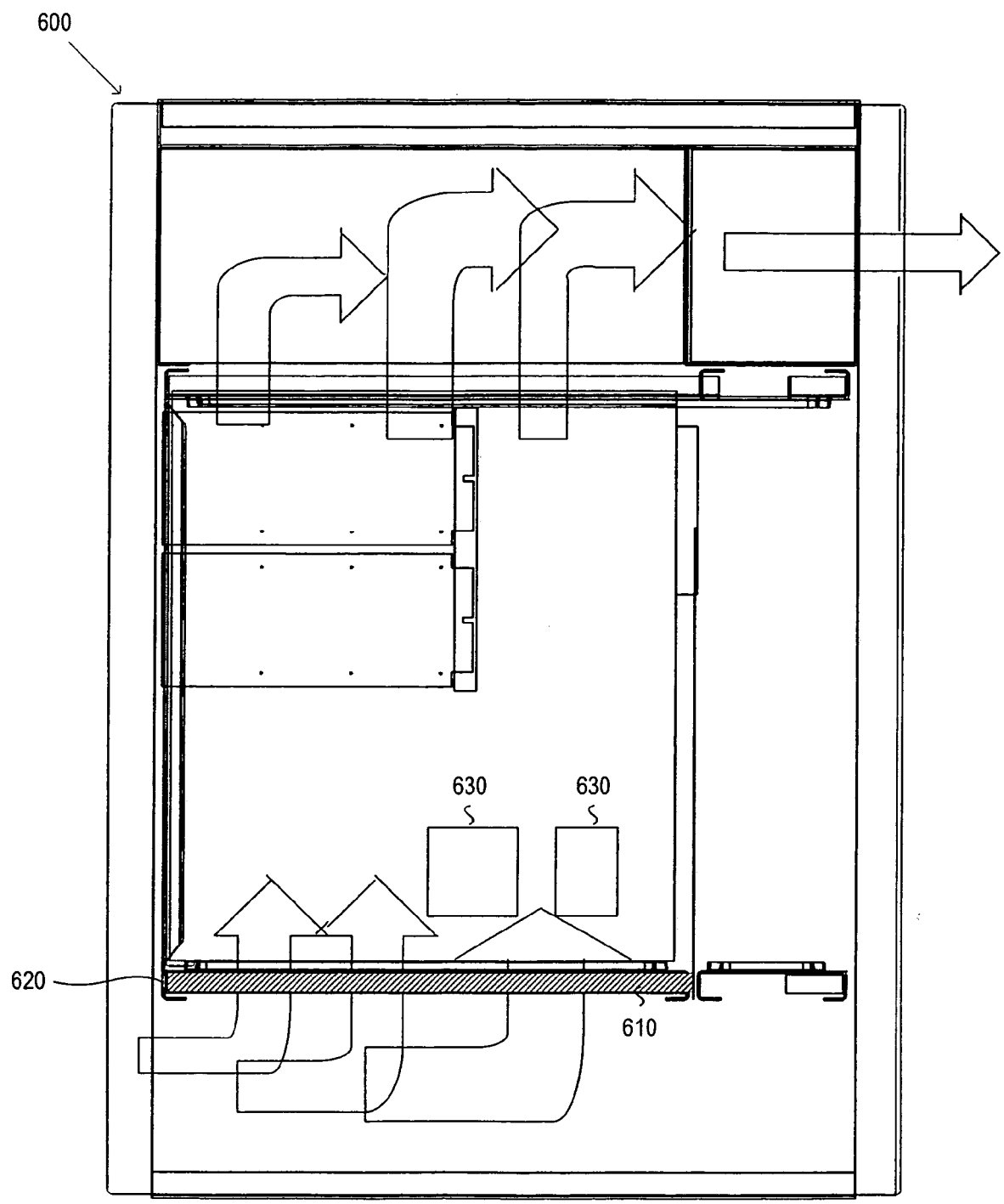
FIG. 6 illustrates a cross-sectional side view of an example chassis and baffle and improved airflow distribution, according to one embodiment.

FIG. 6 illustrates an example chassis 600 (e.g., chassis 200 of FIG. 2) with an example baffle 610 installed on a lower guide rail 620. The baffle 610 improves the airflow through the particular slot so that the airflow is more suited for the particular board installed therein. In this case, the airflow has increased over the back of the board where heat generating components 630 are located as indicated by the larger arrows.

While the baffle has been discussed above with specific emphasis on ATCA chassis' and boards, the baffle is not limited thereby. Rather, the baffle can be applied to other modular computing form factors. The baffle is also not limited to boards containing processors as the heat generating device, but is applicable to other components as well. The baffle can be used for cooling any heat generating components.

Although the various embodiments have been illustrated by reference to specific embodiments, it will be apparent that various changes and modifications may be made. Reference to "one embodiment" or "an embodiment" means that a particular feature, structure or characteristic described in connection with the embodiment is included in at least one embodiment. Thus, the appearances of the phrase "in one embodiment" or "in an embodiment" appearing in various places throughout the specification are not necessarily all referring to the same embodiment.

The various embodiments are intended to be protected broadly within the spirit and scope of the appended claims.

What is claimed:

1. An apparatus to redistribute airflow through slots of a chassis that houses boards, the apparatus comprising:
    at least one restriction region to limit airflow therethrough;
    an open region to allow airflow to pass therethrough, wherein at least some of the airflow limited by the at least one restriction region will flow through said open region; and
    a connection mechanism to connect said apparatus to a chassis.

2. The apparatus of claim 1, wherein airflow through said at least one restriction region and through said open region is based at least in part on a free area ratio of said at least one restriction region.

3. The apparatus of claim 1, wherein said connection mechanism removably connects said apparatus to the chassis.

4. The apparatus of claim 1, wherein said connection mechanism removably connects said apparatus to slots for housing boards within the chassis.

5. The apparatus of claim 1, wherein placement of said at least one restriction region and said open region are based on heat generation parameters of an associated board.

6. The apparatus of claim 5, wherein said open region is aligned with highest heat generating components on the associated board.

7. The apparatus of claim 1, wherein the chassis is a telecommunications chassis.

8. The apparatus of claim 1, wherein the chassis is an Advanced Telecommunications Computing Architecture (ATCA) compliant chassis.

9. The apparatus of claim 1, wherein the chassis includes non-painted electrostatic discharge (ESD) terminals.

10. A telecommunications chassis comprising
    a frame;

a housing to provide a plurality of slots within said frame, wherein the slots include guide rails to support telecommunications boards housed vertically in the slots; and a baffle removably connected to the guide rails for a particular slot, wherein said baffle modifies airflow through the particular slot by redirecting the airflow, wherein the airflow is directed to portions of the slot associated with heat generating components on a telecommunications board housed in the slot.

11. The chassis of claim 10, wherein said baffles include at least one restriction region to limit airflow and an open region to allow airflow to pass therethrough, wherein at least some of the airflow limited by the at least one restriction region will flow through the open region.

12. The chassis of claim 11, wherein the open region is aligned with highest heat generating components on the telecommunications board.

13. The chassis of claim 10, wherein the chassis is an Advanced Telecommunications Computing Architecture (ATCA) compliant chassis.

14. The chassis of claim 10, further comprising non-painted electrostatic discharge (ESD) terminals.

15. The chassis of claim 10, wherein the airflow through said housing is provided by an air flow system that includes
a first open space on one side of said housing;
a second open space on an opposite side of said housing; and
a fan in the second open space to pull the air from the first open space to the second open space and across the telecommunications board.

16. The chassis of claim 15, wherein said baffle is connected between the first open space and the telecommunications board so as to redirect airflow across the telecommunications board.

17. A method to redistribute airflow through a chassis that houses boards, the method comprising:
utilizing airflow from a first side of a chassis to a second side of the chassis to cool boards housed in the chassis; and
redistributing the airflow by utilizing a baffle having at least one restriction region and an open region, wherein the at least one restriction region limits airflow therethrough and at least some of the airflow limited by the at least one restriction region is redistributed through the open region.

18. The method of claim 17, wherein said redistributing includes aligning the at least one restriction region and the open region based on heat generation parameters of an associated board.

19. The method of claim 17, wherein said redistributing includes aligning the open region with highest heat generating components on an associated board.

20. The method of claim 17, wherein the chassis is an Advanced Telecommunications Computing Architecture (ATCA) compliant chassis.

21. A method comprising removably connecting a baffle to a slot housing a board in a telecommunications chassis, wherein the baffle modifies airflow through the telecommunications chassis by redirecting the airflow to portions of the slot associated with heat generating components on the board housed in the slot.

22. The method of claim 21, wherein the baffle includes at least one restriction region to limit airflow and an open region to allow airflow to pass therethrough, wherein at least some of the airflow limited by the at least one restriction region will flow through the open region.

23. The method of claim 22, further comprising providing the baffle having the open region aligned with highest heat generating components on the board.

24. The method of claim 21, wherein the telecommunications chassis is an Advanced Telecommunications Computing Architecture (ATCA) compliant chassis.

25. The method of claim 21, further comprising creating an airflow from a first side of the telecommunications chassis to a second side of the telecommunications chassis by utilizing a fan on the second side to pull air from the first side through the telecommunications chassis.

* * * * *